(12) United States Patent
Kimura et al.

(10) Patent No.: US 6,487,085 B1
(45) Date of Patent: Nov. 26, 2002

(54) HIGH-FREQUENCY MODULE AND METHOD OF MANUFACTURING THE SAME

(75) Inventors: Junichi Kimura, Aichi (JP); Ryouji Mitsuzono, Aichi (JP); Terumoto Akatsuka, Aichi (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/673,949

(22) PCT Filed: Feb. 22, 2000

(86) PCT No.: PCT/JP00/00990
§ 371 (c)(1),
(2), (4) Date: Dec. 12, 2000

(87) PCT Pub. No.: WO00/51182
PCT Pub. Date: Aug. 31, 2000

(30) Foreign Application Priority Data

Feb. 24, 1999 (JP) .......................................... 11-046233

(51) Int. Cl.[7] .................................................. H05K 1/18
(52) U.S. Cl. ...................... 361/763; 361/718; 361/764; 361/782; 174/52.1; 174/52.4; 257/416
(58) Field of Search .................................. 361/763, 761, 361/764, 782, 811, 715, 718, 734; 174/52.1, 52.4; 257/416

(56) References Cited

U.S. PATENT DOCUMENTS

| | | | | |
|---|---|---|---|---|
| 4,750,246 A | * | 6/1988 | Pollard ...................... 29/25.35 |
| 5,103,283 A | * | 4/1992 | Hite ............................ 257/724 |
| 5,438,305 A | * | 8/1995 | Hikita et al. ............... 174/52.1 |
| 5,539,358 A | * | 7/1996 | Hedberg .................. 331/107 A |
| 5,798,557 A | * | 8/1998 | Salatino et al. ............. 257/416 |
| 6,133,674 A | * | 10/2000 | Fry ............................ 310/341 |

FOREIGN PATENT DOCUMENTS

| | | |
|---|---|---|
| JP | 8-83882 | 3/1996 |
| JP | 10-98151 | 4/1998 |
| JP | 11-220090 | 8/1999 |
| WO | WO98/31104 | 7/1998 |

OTHER PUBLICATIONS

Search report corresponding to application No. PCT/JP00/00990 dated May 23, 2000.
English translation of Form PCT/ISA/210.

* cited by examiner

Primary Examiner—David Martin
Assistant Examiner—Hung Bui
(74) Attorney, Agent, or Firm—RatnerPrestia (57) ABSTRACT

A miniaturized high-frequency module includes an integrated circuit and chip capacitors electrically connected therewith within a recess in a substrate and to make a crystal oscillator and the substrate virtually equal in size. Thereby, a miniaturized high-frequency module can be obtained.

6 Claims, 10 Drawing Sheets

HIGH-FREQUENCY MODULE AND METHOD OF MANUFACTURING THE SAME

This Application is a U.S. National Phase Application of PCT International Application PCT/JP99/00990.

1. Field of the Invention

The present invention relates to a high-frequency module for use in a mobile telephone and the like and a method of manufacturing the same.

2. Background Art

Figure 10:
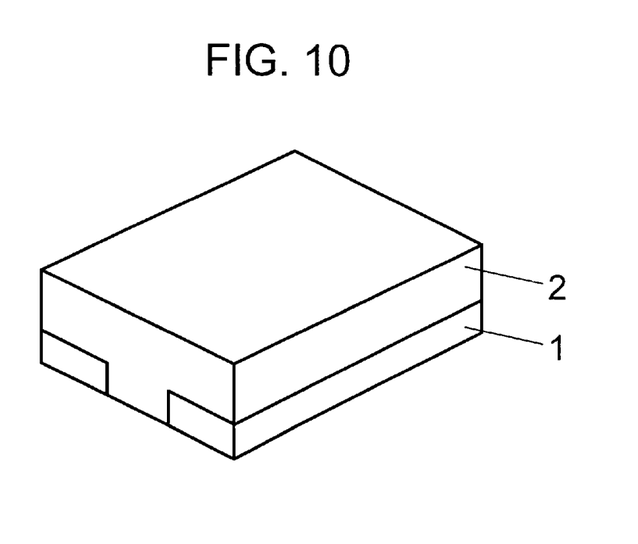
FIG. 10 is a perspective view of a prior-art temperature-compensated oscillator.
Figure 11:
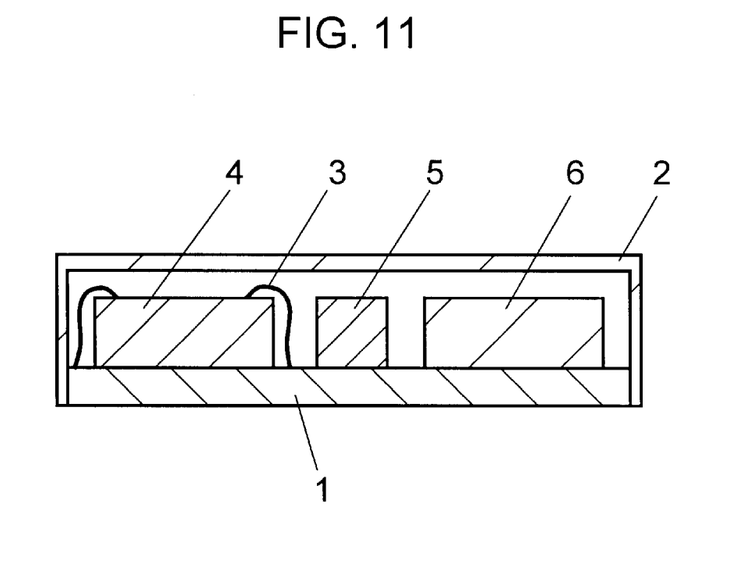
FIG. 11 is a sectional view of a prior-art temperature-compensated oscillator.

A conventional high-frequency module will be described below. A typical conventional high-frequency module, as shown in FIG. 10, has substrate 1 made of an insulator of ceramic material or the like with electronic components mounted thereon and metallic shield case 2 is placed over them. On substrate 1, as shown in FIG. 11, there is a temperature-compensated oscillator, having a stable characteristic regardless of ambient temperature changes (used here as an example of the high-frequency module), constructed of integrated circuit 4 bonded by wires 3 and chip capacitor 5 and crystal oscillator (used here as an example of the filter) 6 connected by reflow soldering.

Figure 12:
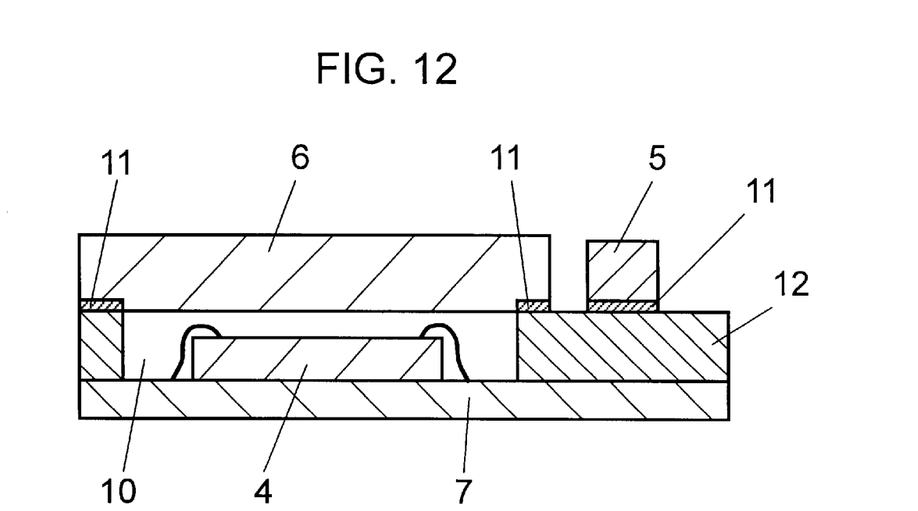
FIG. 12 is a sectional view of a second prior-art temperature-compensated oscillator.

To miniaturize the temperature-compensated oscillator, recess 10 is formed in substrate 7, as shown in FIG. 12, and while integrated circuit 4 is wirebonded to the bottom surface of recess 10, crystal oscillator 6 placed on the recess 10 so as to cover recess 10. And chip capacitor 5, of a size of 1.0 mm long and 0.5 mm wide, is placed on top surface 12 on the same side and they are reflow-soldered with solder cream 11. By placing crystal oscillator 6 over integrated circuit 4 in the described manner, miniaturization of the high-frequency module has been attained.

Figure 13:
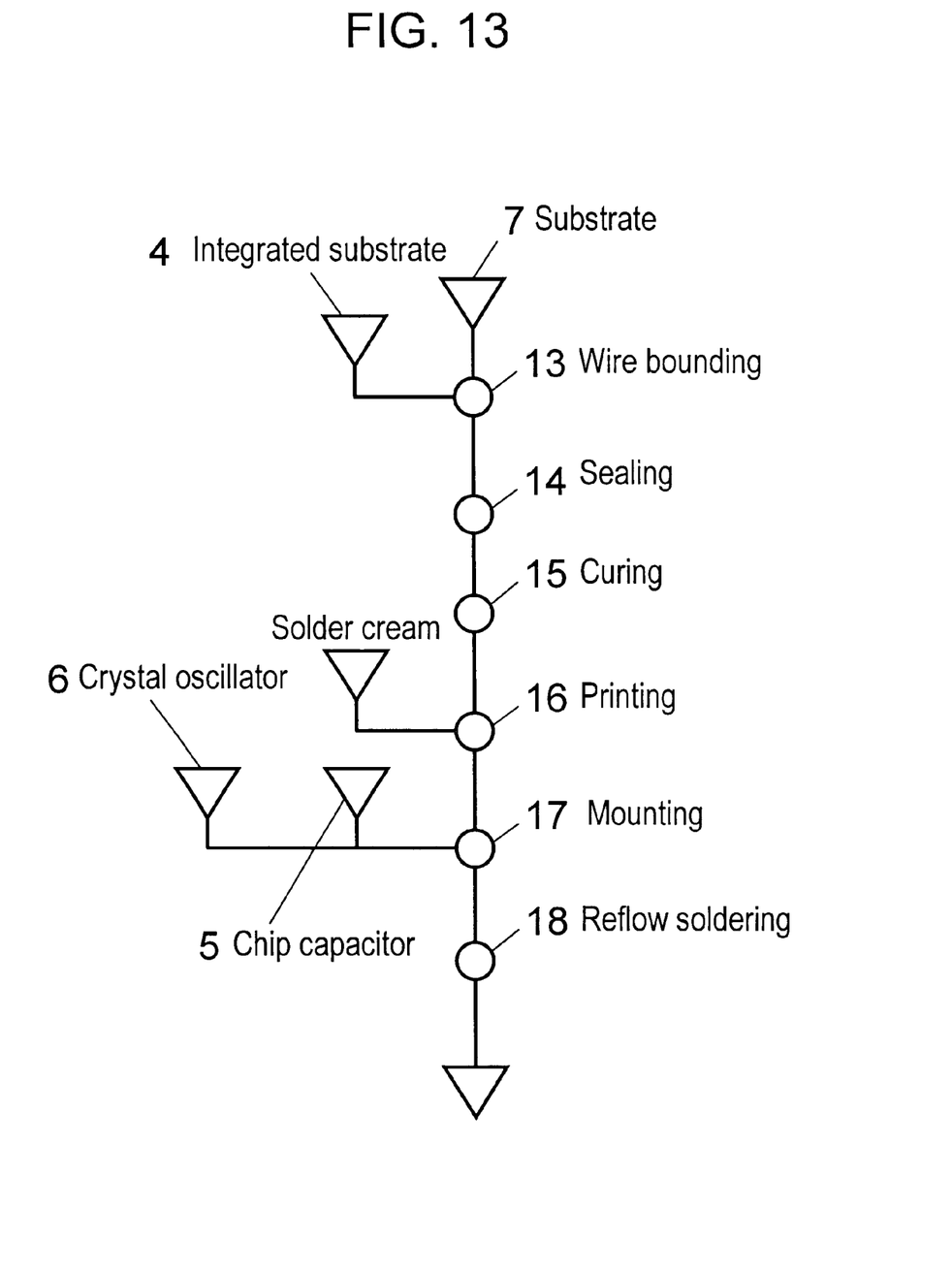
FIG. 13 is a flowchart of manufacturing a second prior-art temperature-compensated oscillator.

The method of fabrication of the prior art high-frequency module, as shown in FIG. 13, comprises:

first step 13 of wire-bonding integrated circuit 4 to the bottom surface of recess 10 of a substrate with a recess therein;

second step 14, following first step 13, of sealing integrated circuit 4 with an bonding material;

third step 15, following second step 14, of curing the bonding material;

fourth step 16, following third step 15, of applying solder cream to the top surface 12 near the recess 10 by printing;

fifth step 17, following fourth step 16, of mounting chip capacitor 5 and crystal oscillator 6 on solder cream 11 applied as above; and sixth step 18, following fifth step 17, of bonding chip capacitor 5 and crystal oscillator 6 to the side of top surface 12 of substrate 7 by the application of heat.

By mounting crystal oscillator 6 over the integrated circuit 4, more and more miniaturization of high-frequency modules has been attained.

However, while there are demands for still more miniaturized high-frequency modules, the conventional arrangement is unable to meet such demands because of the limit in obtaining a smaller size than sum of the sizes of crystal oscillator 6 and chip capacitor 5.

On the other hand, by virtue of recent progress in semiconductor technology, integrated circuits have become increasingly smaller in size and, at the same time, the flip-chip-mounting technology making use of bump contacts has been developed. Accordingly, mounting of an integrated circuit in a very small space has become possible. Also, such a chip capacitor as small as 0.6 mm long and 0.3 mm wide has become available. Consequently, the area of an integrated circuit or that of a chip capacitor has become smaller than that of a crystal oscillator. Thus, a proposal for a structure meeting above described demand has come to be earnestly desired.

The present invention was made to address the above-mentioned problem, and it is an object of the invention to provide a miniaturized high-frequency module.

DISCLOSURE OF THE INVENTION

An exemplary embodiment of the present invention relates to an integrated circuit and chip capacitors, electrically connected with the integrated circuit, within a recess of a substrate, and, also, to make a filter and the substrate approximately equal in size. Thereby, a miniaturized high-frequency module can be obtained.

In a further exemplary embodiment of the present invention a high-frequency module is characterized in that the chip capacitors are bonded to the filter with solder cream. Since the chip capacitors can be bonded to the filter by printed solder cream thereto, the need for applying solder cream within the recess can be eliminated and, hence, productivity is improved.

In a further exemplary embodiment of the present invention a high-frequency module is characterized in that it constitutes a temperature-compensated oscillator by using a crystal oscillator as a filter and an integrated circuit comprising;

an oscillation circuit, an output terminal connected to the oscillation circuit, a temperature compensating circuit, a frequency control circuit, and a stabilized power supply circuit connected with a chip capacitor disposed outside the integrated circuit.

Accordingly, a miniaturized high-frequency module as a temperature-compensated oscillator can be obtained.

In a further exemplary embodiment of the present invention a high-frequency module is, characterized in that it constitutes a receiver comprising;

a first input terminal to which a high-frequency signal is input;

an amplifier receiving the signal input to the first input terminal through a first chip capacitor;

a SAW filter receiving an output of the amplifier;

a mixer receiving an output of the SAW filter at one input thereof;

an output terminal to which an output of the mixer is delivered through a second chip capacitor; and a second input terminal to which a local oscillation frequency to be input to the other terminal of the mixer through a third chip capacitor is applied.

By inputting a high-frequency signal to the first input terminal and a local oscillation frequency to the second input terminal, a miniaturized receiver can be obtained.

In a further exemplary embodiment of the present invention a high-frequency module is, characterized in that it constitutes a transmitter comprising;

an input terminal to which a high-frequency signal is input;

a SAW filter receiving the input signal input to the input terminal through a first chip capacitor;

an amplifier receiving an output of the SAW filter; and an output terminal to which an output of the amplifier is delivered through a second chip capacitor.

By inputting a modulated signal to the input terminal and connecting a signal delivered from the output terminal to the antenna, a miniaturized transmitter can be obtained.

In a further exemplary embodiment of the present invention a high-frequency module comprises;
  a substrate made of an insulator,
  a recess formed in the substrate,
  a PLL integrated circuit flip-chip-mounted to the bottom surface of the recess,
  a voltage-controlled oscillator electrically connected with the PLL integrated circuit and disposed on the top surface of the substrate so as to cover the recess, and
  a low-pass filter made up of chip components electrically connected with the PLL integrated circuit, the low-pass filter contained within the recess,
  wherein the voltage-controlled oscillator and the substrate are made virtually equal in size.

By containing the flip-chip-mounted PLL integrated circuit and the low-pass filter made up of chip components within the recess, the substrate and the voltage-controlled oscillator can be made virtually equal in size and, hence, a miniaturized high-frequency module can be embodied The invention set forth in claim 7 is a method of manufacturing a high-frequency module comprising the steps of;
  first step of flip-chip-mounting an integrated circuit on a bottom surface of a recess of a substrate with the recess therein;
  second step, following first step, of sealing the integrated circuit with bonding material;
  third step, following second step, of curing the bonding material;
  fourth step, following third step, of applying solder cream to the bottom surface of the recess;
  fifth step, following fourth step, of mounting chip capacitors on the applied solder cream;
  sixth step, following fifth step, of bonding the chip capacitors by application of heat;
  seventh step, following sixth step, of applying solder cream to a top surface of the substrate by printing;
  eighth step, following seventh step, of mounting a filter;
  and ninth step, following eighth step, of bonding the filter to the top surface by application of heat.

Since solder cream is applied to the bottom surface of the recess at third step, the chip capacitors are mounted within the recess at fourth step, and the chip capacitors are bonded at fifth step, a miniaturized high-frequency module can be obtained.

In a further exemplary embodiment of the present invention a method of manufacturing a high-frequency module is characterized by including a process for preparing a first component comprising the steps of;
  first step, of flip-chip-mounting an integrated circuit on a bottom surface of a recess of a substrate with the recess therein;
  second step, following first step, of sealing the integrated circuit with an bonding material;
  third step, following second step, of curing the bonding material; and
  fourth step, following third step, of applying solder cream to the top surface of the substrate on the side of the recess by printing; and
  a process for preparing a second component separate from the process for preparing the first component comprising;
  first step of applying solder cream to a filter by printing;
  second step, following first step, of mounting chip capacitors on the solder cream applied by printing; and
  third step, following second step, of bonding the chip capacitors by the application of heat;
  and steps of mounting the second component on the top surface of the substrate of the first component and bonding, thereafter, the components with each other by the application of heat.

Since the chip capacitors are mounted on the filter in the process for preparing the second component, solder cream can be applied by printing and, hence, productivity is improved.

The invention set forth in claim 9 is a method of manufacturing a high-frequency module characterized by including a process for preparing a first component comprising;
  first step of flip-chip-mounting an integrated circuit on a bottom surface of a recess of a substrate with the recess therein;
  second step, following first step, of sealing the integrated circuit with an bonding material; and
  third step, following second step, of curing the bonding material;
  and, applying solder cream to a filter by printing which is separate process from the processes for preparing the first component;
  fourth step of mounting the first component and chip capacitors on the solder cream applied on the filter by printing; and
  fifth step, following fourth step, of simultaneously bonding the chip capacitors and the first component by the application of heat.

Since the chip capacitors and the first component can be simultaneously bonded at fifth step, productivity is improved further.

Exemplary embodiments of the present invention will be described with reference to the drawings.

BEST MODE FOR CARRYING OUT THE INVENTION

First Embodiment

Figure 1:
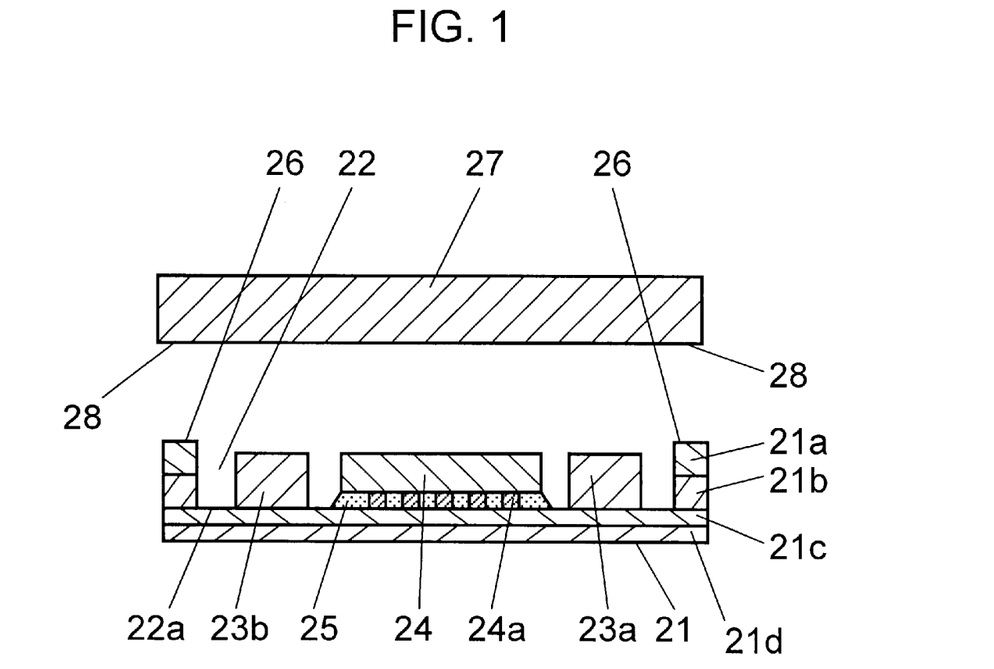
FIG. 1 is a sectional view of a temperature-compensated oscillator according to the first embodiment of the invention.

FIG. 1 is a sectional view of a temperature-compensated oscillator (used here as an example of the high-frequency module) of first embodiment of the present invention. In FIG. 1, reference numeral 21 denotes a ceramic substrate made of laminated four ceramic sheets 21a, 21b, 21c, and 21d. The substrate has a size of approximately 3.0 mm long, 5.0 mm wide, and 0.6 mm high, and it has recess 22 formed in the center thereof. On bottom surface 22a of recess 22 are mounted chip capacitors 23a and 23b, and, further, flip-chip-mounted integrated circuit 24 connected by means of bumps 24a. Reference numeral 25 denotes a sealing agent (under-fill) as an insulating material serving the purposes of fixing integrated circuit 24 to bottom surface 22a and protecting the circuit surface of integrated circuit 24. Reference numeral 26 denotes a top surface of substrate 21 provided on the surface where recess 22 is formed. Terminals of integrated circuit 24 are connected with wiring patterns on the ceramic material.

Reference numeral 27 denotes a crystal oscillator whose oscillation frequency ranges 10–20 MHz. The size of the same is approximately 3.0 mm long, 5.0 mm wide, and 0.7 mm high. Electrodes of crystal oscillator 27 are lead out by means of a wiring pattern to position 28 corresponding to top surface 26. The electrodes of crystal oscillator 27 and terminals of integrated circuit 24 are electrically connected by soldering with a solder cream. By the arrangement of crystal oscillator 27 fixed so as to cover recess 22, a temperature-compensated oscillator having an overall size approximately 3.0 mm long, 5.0 mm wide, and 1.3 mm high can be completed.

By connecting the flip-chip type integrated circuit 24 of by means of bumps 24a and making chip capacitors 23a and 23b of 0.6 mm long and 0.3 mm wide embedded in recess 22 as described above, the product can be miniaturized to the size equivalent to crystal oscillator 27.

Figure 2:
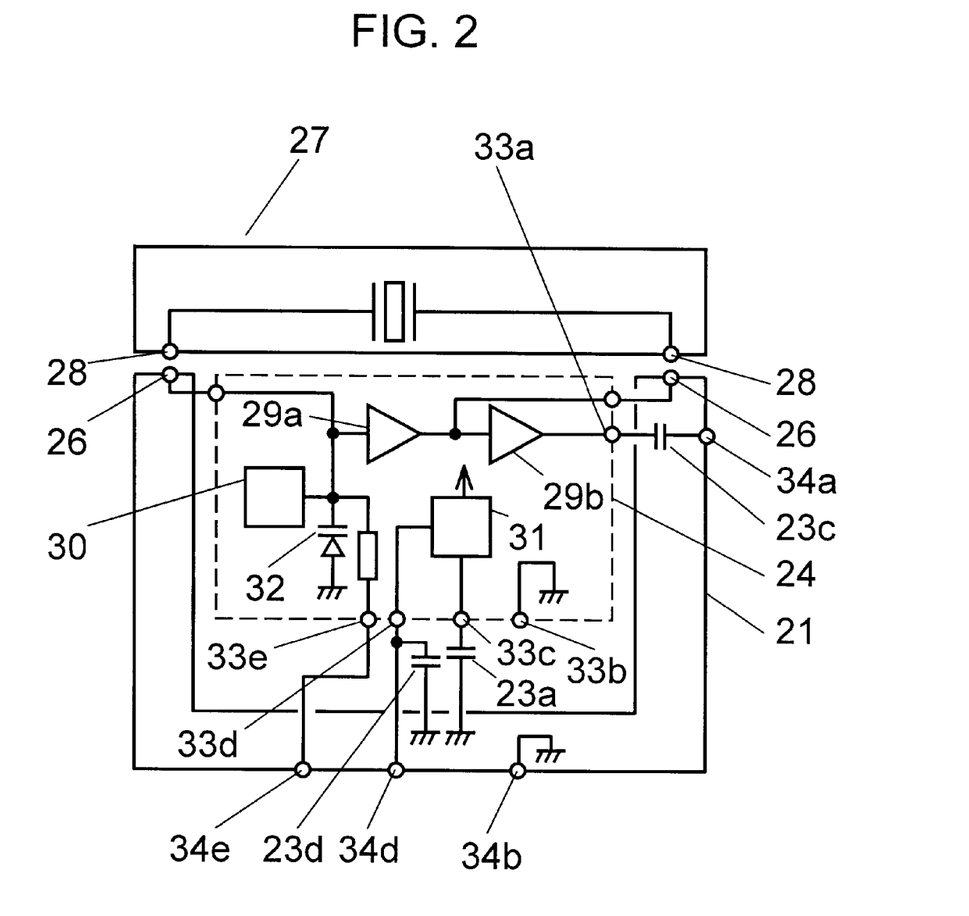
FIG. 2 is a block diagram of a temperature-compensated oscillator according to the first embodiment of the invention.

FIG. 2 is a circuit diagram of the temperature-compensated oscillator of the present embodiment. In FIG. 2, reference numerals 29a and 29b denote amplifiers provided within integrated circuit 24, 30 denotes a temperature compensating circuit, 31 denotes a stabilized power supply circuit, and 32 denotes a varicap diode (variable-capacitance diode), all of them are incorporated in integrated circuit 24. Between the input and output of amplifier 29a, there is connected crystal oscillator 27, and the crystal oscillator 27 and varicap diode 32 connected between the input of amplifier 29a and the ground constitute a resonant circuit to determine the oscillation frequency. The output of the oscillator produced in amplifier 29a is connected to output terminal 33a through next amplifier 29b. Further, output terminal 33a is connected to terminal 34a provided on substrate 21 through chip capacitor 23c (not shown in FIG. 1). Temperature compensating circuit 30 is connected to the input of amplifier 29a to compensate changes in frequency of the resonant circuit due to ambient temperature changes. Reference numerals 33e and 34e denote input terminals for frequency controlling voltage. Input terminal 34e is connected to varicap diode 32 for controlling the oscillation frequency in accordance with the control voltage. Reference numerals 33d and 34d denote power supply terminals which supply a stabilized voltage to each circuit through stabilized power supply circuit 31. Reference numerals 33b and 34b denote grounding terminals. Further, stabilized power supply circuit 31 is connected with chip capacitor 23a through terminal 33c.

Figure 3:
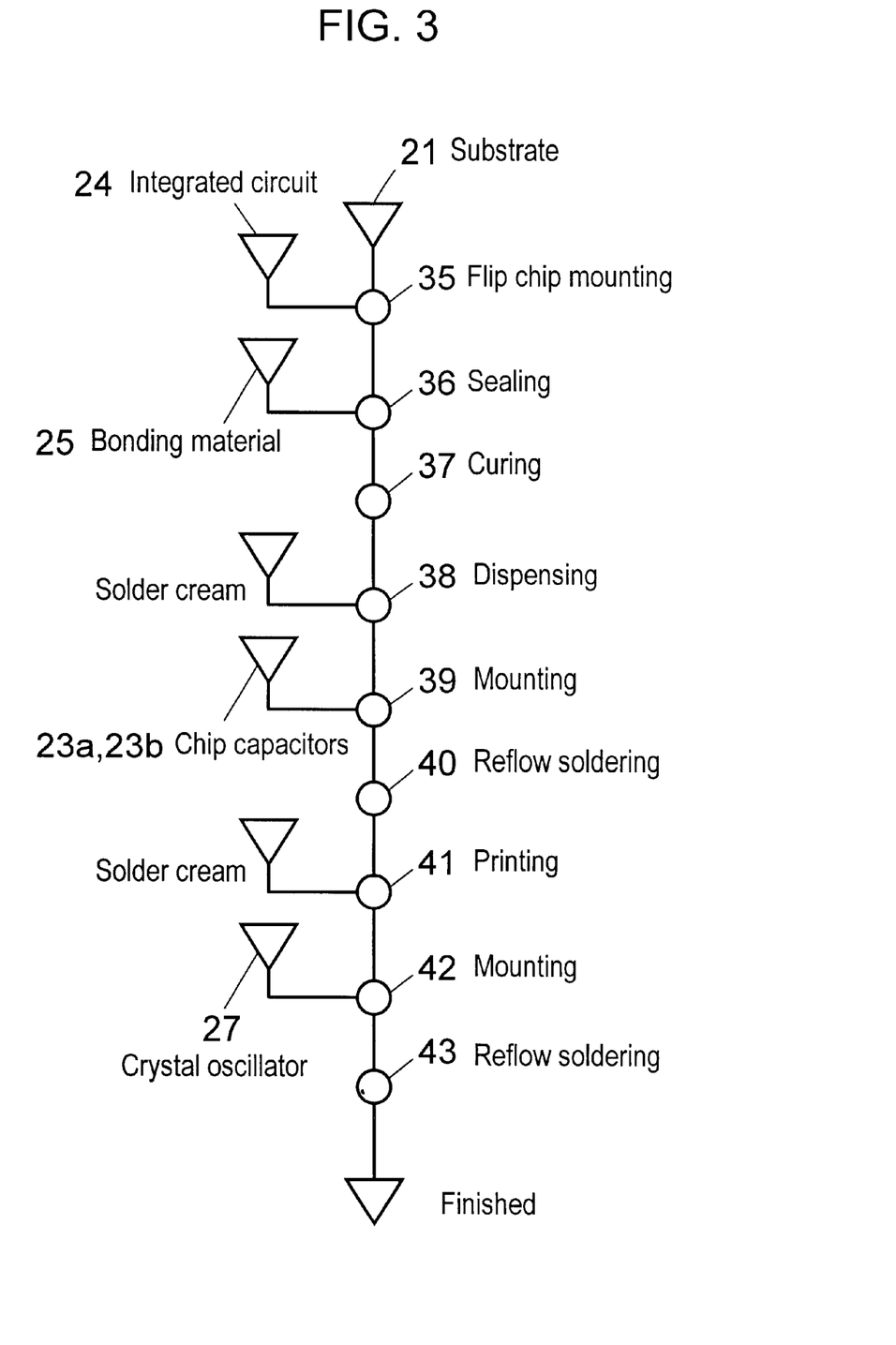
FIG. 3 is a flowchart of manufacturing a temperature-compensated oscillator according to the first embodiment of the invention.

The method of manufacturing above temperature compensated oscillator will be described with reference to FIG. 3. The method of fabricating the temperature-compensated oscillator according to present embodiment comprises:

first step 35 of flip-chip-mounting integrated circuit 24 on bottom surface 22a of recess 22 of a substrate with a recess therein;

second step 36, following first step 35, of sealing integrated circuit 24 with bonding material 25;

third step 37, following second step 36, of curing bonding material 25;

fourth step 38, following third step 37, of applying solder cream to bottom surface 22a of recess 22 with a dispenser or the like;

fifth step 39, following fourth step 38, of mounting chip capacitors 23a and 23b on the applied solder cream;

sixth step 40, following fifth step 39, of bonding chip capacitors 23a and 23b, by the application of heat;

seventh step 41, following sixth step 40, of applying solder cream to the top surface 26 of substrate 21 by printing;

eighth step 42, following seventh step 41, of mounting crystal oscillator 27; and ninth step 43, following eighth step, of bonding crystal oscillator 27 to the top surface 26 by the application of heat. Since solder cream is applied to bottom surface 22a of recess 22 at fourth step 38, chip capacitors 23a and 23b are mounted within recess 22 at fifth step 39, and they are bonded at sixth step, a miniaturized temperature-compensated oscillator can be obtained.

Second Embodiment

Figure 4:
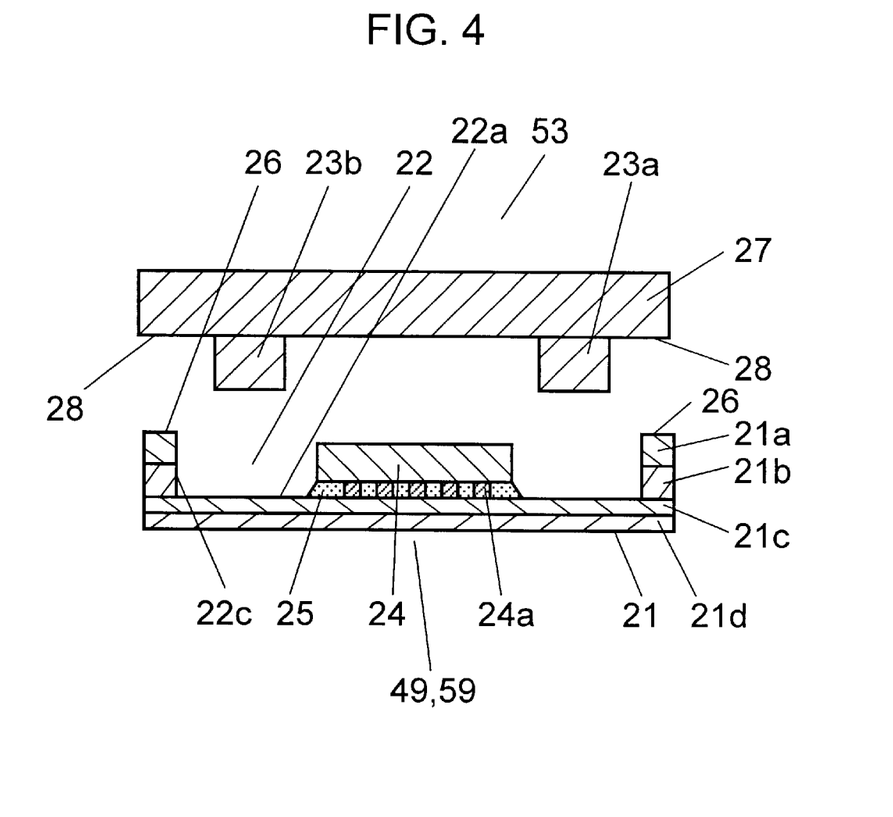
FIG. 4 is a sectional view of a temperature-compensated oscillator according to the second embodiment of the invention.

FIG. 4 is a sectional view of a temperature-compensated oscillator (used here as an example of the high-frequency module) of the second embodiment. In FIG. 4, the point different from first embodiment is that chip capacitors 23a and 23b are bonded with solder cream to a surface of the crystal oscillator 27. Namely, wiring for the chip capacitors 23a and 23b are disposed on surface 28, confronting top surface 26 on the substrate 21 where recess 22 is formed, to be electrically connected to integrated circuit 24 with solder cream. By virtue of the arrangement of chip capacitors 23a and 23b between inner surface 22c of recess 22 and integrated circuit 24 (as with the first embodiment), it is achieved to make the temperature-compensated oscillator thinner.

The arrangement of chip capacitors 23a and 23b on the surface of crystal oscillator 27 in the present embodiment makes it possible to apply solder cream by printing so that the need for using a dispenser as in the first embodiment can be eliminated and, hence, productivity is improved.

Figure 5:
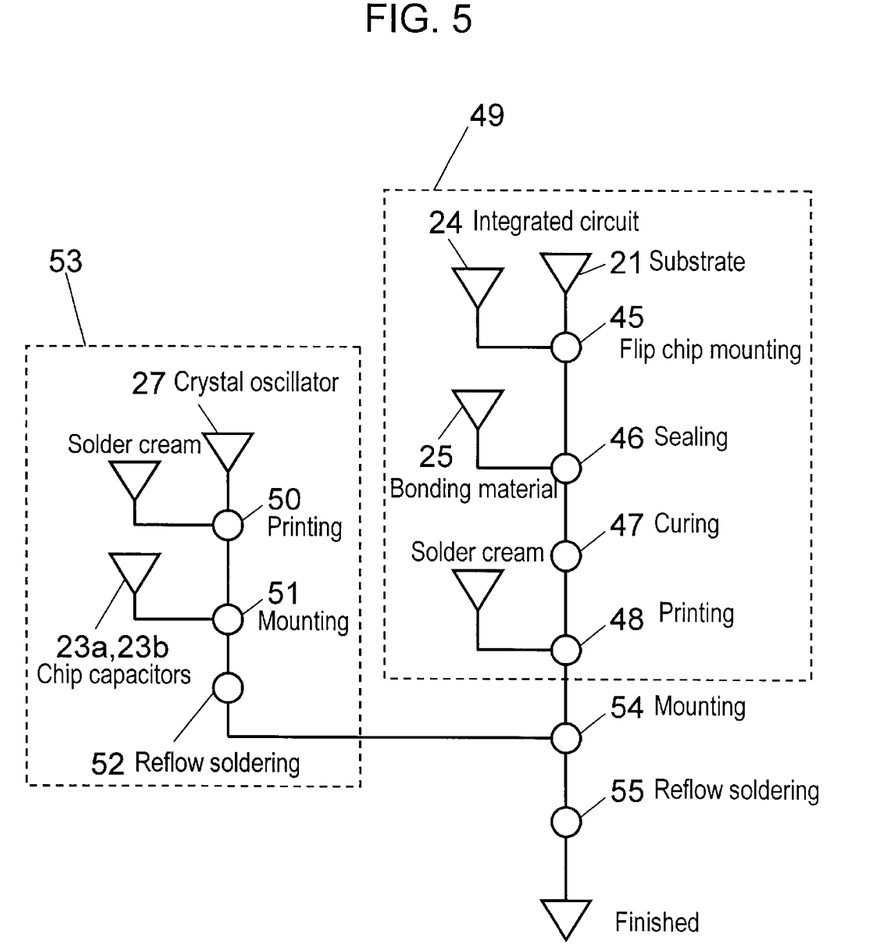
FIG. 5 is a flowchart of manufacturing a temperature-compensated oscillator according to the second embodiment of the invention.

Accordingly, the method of manufacturing becomes as shown in FIG. 5. Namely, the method comprises:

a process for preparing a first component through:

first step 45 of flip-chip-mounting integrated circuit 24 on bottom surface 22a of recess 22 of a substrate with a recess therein;

second step 46, following first step 45, of sealing integrated circuit 24 with bonding material 25;

third step 47, following second step 46, of curing bonding material 25; and fourth step 48, following third step 47, of applying solder cream to top surface 26 of substrate 21 having recess 22 by printing;

a process for preparing second component 53, separate from the process for preparing first component 49, through:

first step 50 of applying solder cream to crystal oscillator 27 by printing;

second step 51, following first step 50, of mounting chip capacitors 23a and 23b on the solder cream applied by printing; and third step 52, following second step 51, of bonding chip capacitors 23a and 23b by the application of heat;

step 54 of mounting second component 53 on top surface 26 of substrate 21 of first component 49; and step 55 of bonding the components together by the application of heat.

Since chip capacitors 23a and 23b are mounted on the crystal oscillator 27 in second component 53, it is possible to apply solder cream by printing and, hence, productivity is improved.

Third Embodiment

Figure 6:
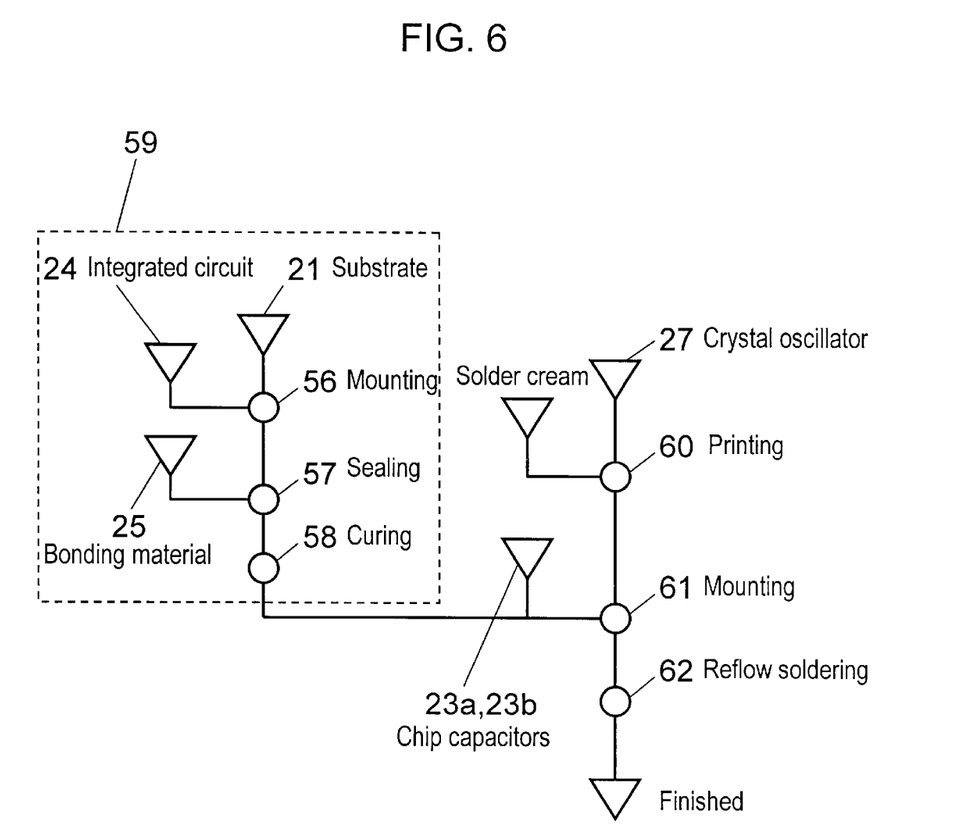
FIG. 6 is a flowchart of manufacturing a temperature-compensated oscillator according to the third embodiment of the invention.

FIG. 6 is a flowchart of the fabrication method of a temperature-compensated oscillator (used here as an example of the high-frequency module) of present embodiment. What is different in FIG. 6 from the second embodiment is that substrate 21, chip capacitors 23a and 23b, and crystal oscillator 27 are simultaneously bonded so that productivity is improved still more.

Namely, the method of fabricating the temperature-compensated oscillator comprises:

a process for preparing first component 59 through:

first step 56 of flip-chip-mounting integrated circuit 24 on bottom surface 22a of recess 22 of a substrate with a recess therein;

second step 57, following first step 56, of sealing integrated circuit 24 with bonding material 25; and third step 58, following second step 57, of curing bonding material 25;

step 60, in a process separate from the process for preparing first component 59, of applying solder cream on crystal oscillator 27 by printing;

step 61, following step 60, of mounting first component 59 and chip capacitors 23a and 23b on the solder cream applied by printing, and step 62, following step 61, of simultaneously bonding chip capacitors 23a and 23b and first component 59 by the application of heat.

Since chip capacitors 23a and 23b and first component 59 are simultaneously bonded at step 62, productivity is improved further.

Fourth Embodiment

Figure 7:
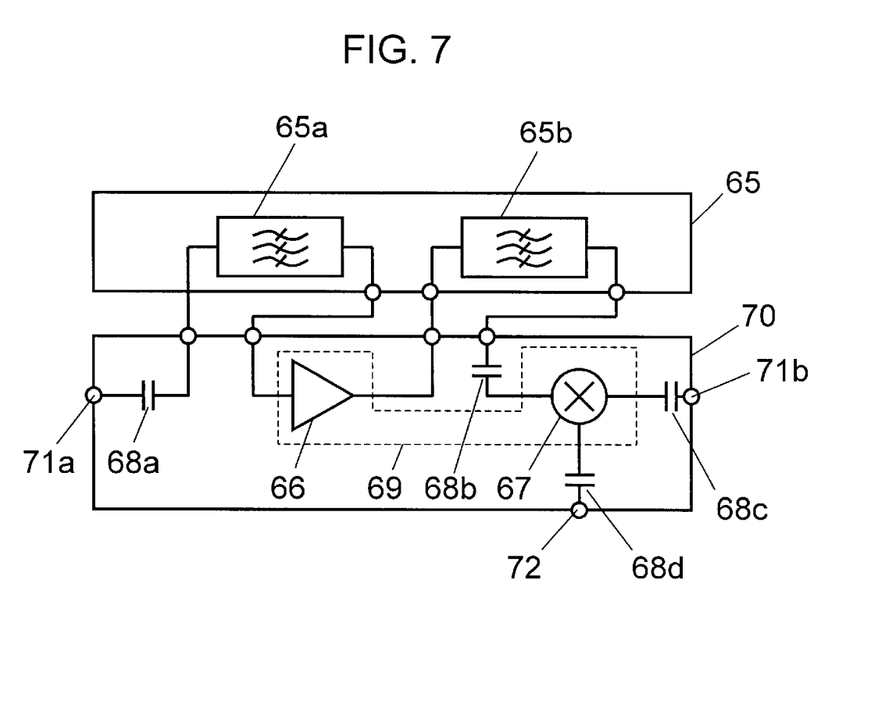
FIG. 7 is a block diagram of a receiver according to the fourth embodiment of the invention.

FIG. 7 is a block diagram of a receiver for use in mobile telephone and the like (used here as an example of the high-frequency module). In FIG. 7, reference numerals 65a and 65b denote SAW (surface acoustic wave) filters, which are bandpass filters allowing to pass UHF band frequencies. Reference numeral 66 denotes an amplifier and 67 denotes a mixer, both of them are incorporated in integrated circuit 69. Reference numerals 68a, 68b, 68c, and 68d denote chip capacitors. Such integrated circuit 69 and chip capacitors 68a, 68b, 68c, and 68d are contained within recess 70a (not shown) formed in insulating ceramic substrate 70. In this embodiment, while the size of SAW filter assembly 65 made of SAW filters 65a and 65b is determined by the transmission frequencies, miniaturization of the receiver is achieved by adapting the size of substrate 70 to the size of SAW filter 65.

The circuit of the receiver, as shown in FIG. 7, is constructed of;

input terminal 71a to which a high-frequency UHF band signal is applied, chip capacitor 68a connected with input terminal 71a, SAW filter 65a connected to chip capacitor 68a, amplifier 66 connected to the output of SAW filter 65a, SAW filter 65b connected to the output of amplifier 66, chip capacitor 68b connected to the output of SAW filter 65b, mixer 67 one terminal of which is connected to the output of chip capacitor 68b, output terminal 71b connected with the output of mixer 67 through chip capacitor 68c, and input terminal 72 allowing a local oscillation frequency to be connected to the other terminal of mixer 67 through chip capacitor 68d.

The method of fabrication is similar to that used in the second or the third embodiment.

Fifth Embodiment

Figure 8:
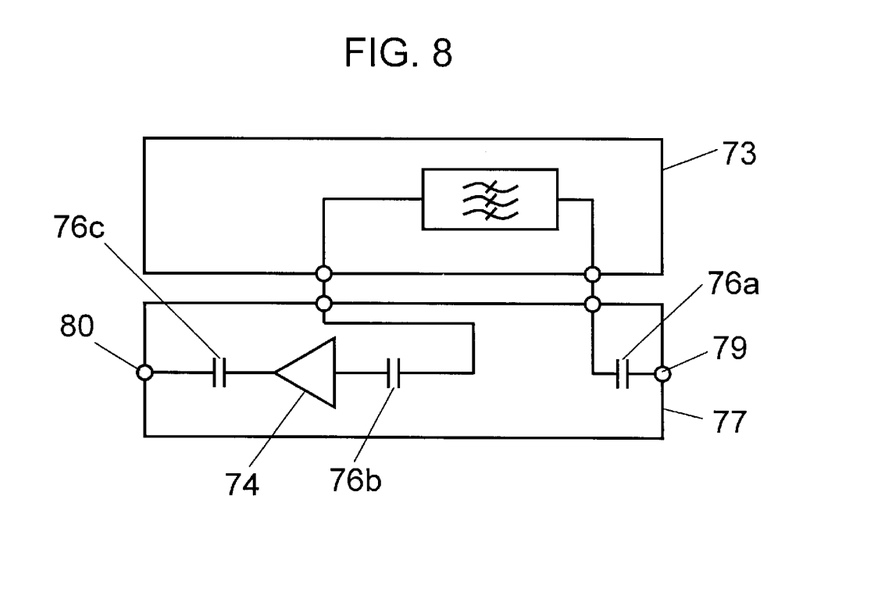
FIG. 8 is a block diagram of a transmitter according to the fifth embodiment of the invention.

FIG. 8 is a block diagram of a transmitter for use in mobile telephone and the like (used here as an example of the high-frequency module). In FIG. 8, reference numeral 73 denotes a SAW filter, which is a bandpass filter to pass UHF band frequencies. Reference numeral 74 denotes a power amplifier incorporated in an integrated circuit (not shown). Reference numerals 76a, 76b, and 76c denote chip capacitors. The integrated circuit and chip capacitors 76a, 76b, and 76c are contained within a recess (not shown) formed in insulating ceramic substrate 77. Also in this embodiment, the size of SAW filter 73 is determined by the frequencies of the transmission band and miniaturization of the transmitter is achieved by adapting the size of substrate 77 to the size of SAW filter 73.

The circuit of the transmitter, as shown in FIG. 8, is constructed of;

input terminal 79 to which a UHF band modulated high-frequency signal is applied, chip capacitor 76a connected with input terminal 79, SAW filter 73 connected to chip capacitor 76a, chip capacitor 76b connected to the output of SAW filter 73, power amplifier 74 connected to the output of chip capacitor 76b, chip capacitor 76c connected to the output of power amplifier 74, and output terminal 80 connected to the output of chip capacitor 76c.

The method of fabrication is similar to that used in the second or the third embodiment.

Sixth Embodiment

Figure 9:
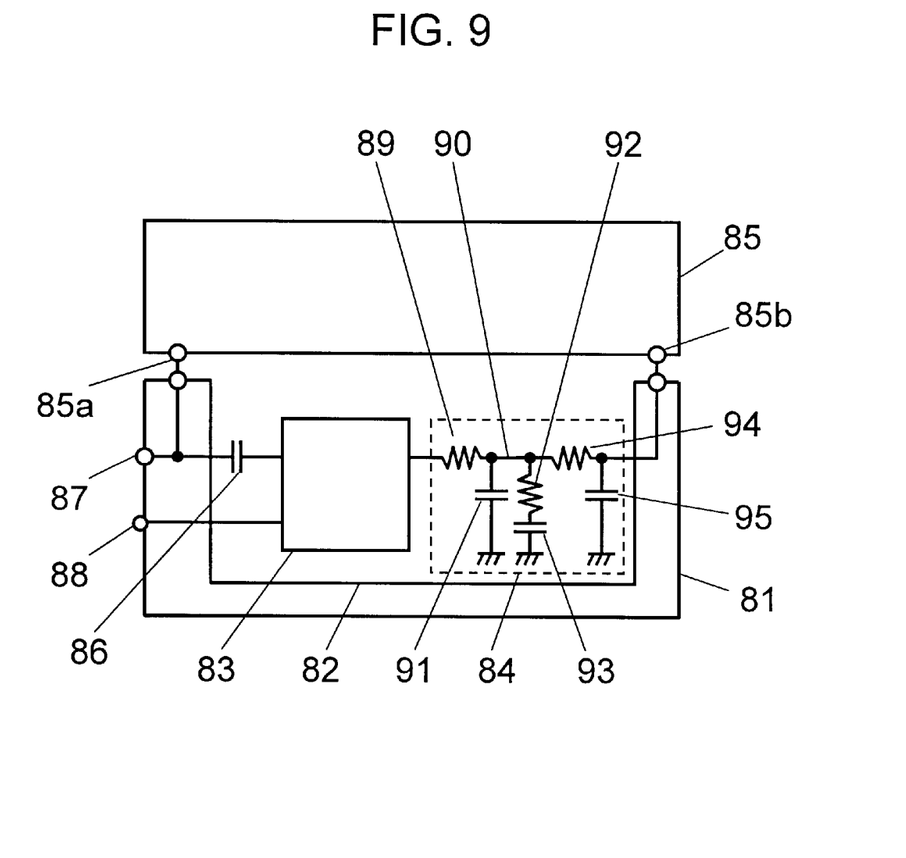
FIG. 9 is a block diagram of a PCO/PLL according to the sixth embodiment of the invention.

FIG. 9 is a block diagram showing a voltage-controlled oscillator (VCO)/PLL module (used here as an example of the high-frequency module) of sixth embodiment. In FIG. 9, the VCO/PLL module of the invention is constructed of;

substrate 81 made of an insulator, recess 82 formed in substrate 81, PLL integrated circuit 83 flip-chip-mounted on the bottom surface of recess 82, and VCO 85 electrically connected with PLL integrated circuit 83 and disposed on the top surface of substrate 81 so as to cover the recess.

Further, low-pass filter 84 made up of chip components electrically connected with PLL integrated circuit 83 is contained within recess 82, and VCO 85 and substrate 81 are made virtually equal in size. Thus, by having bump-connected PLL integrated circuit 83 and low-pass filter 84 made up of chip parts contained within recess 82, the substrate 81 can be made virtually equal to VCO 85 in size, and, hence, a miniaturized VCO/PLL module can be obtained.

In the VCO/PLL module, while output terminal 85*a* of VCO 85 is connected to one input of PLL integrated circuit 83 through chip capacitor 86 (2 pF), the oscillator output is delivered to output terminal 87. Reference numeral 88 denotes an input terminal to which a reference frequency signal is input and the input terminal is connected to the other input of PLL integrated circuit 83. Output of PLL integrated circuit 83 is connected to input terminal 85*b* of VCO 85 through low-pass filter 84 made up of chip components.

Low-pass filter 84 has resistor 89 (1 kΩ) connected to the input thereof and has capacitor 91 (1000 pF) and a series connected resistor 92 (5.6 kΩ) and capacitor 93 (0.047 μF) connected between output 90 of resistor 89 and the ground. Output 90 of resistor 92 is connected with resistor 94 (8.2 kΩ) and the output thereof is connected to input 85*b* of VCO 85. Further, capacitor 95 (4700 pF) is connected between the output of resistor 94 and the ground.

The method of fabrication is similar to that used in the second or the third embodiment. Namely, VCO 85 is used here instead of the filter used in the second or the third embodiment.

INDUSTRIAL APPLICABILITY

According to the present invention, as described above, an integrated circuit and chip capacitors electrically connected therewith are contained within the recess in a substrate and a filter and the substrate are configured to be virtually equal in size. Thus, by having the integrated circuit and chip capacitors contained within the recess, the substrate can be made virtually equal to the filter in size and, hence, a miniaturized high-frequency module can be obtained.

What is claimed is:

1. A high-frequency module comprising:
   a substrate having a recess and made of an insulator;
   an integrated circuit flip-chip-mounted on the bottom surface of said recess, wherein said integrated circuit flip-chip-mounted has bump contacts;
   a filter electrically connected with said integrated circuit, said filter disposed on said substrate so as to cover said recess; and
   a chip capacitor electrically connected with said integrated circuit, said filter disposed on said substrate so as to cover said recess,
   wherein an area of said integrated circuit is smaller than that of said filter, and wherein said filter and said substrate are virtually equal in size.

2. The high-frequency module according to claim 1, wherein said chip capacitor is fixed to said filter using solder cream.

3. A high-frequency module comprising:
   a substrate having a recess and made of an insulator;
   an integrated circuit flip-chip-mounted on the bottom surface of said recess;
   a filter electrically connected with said integrated circuit, said filter disposed on said substrate so as to cover said recess; and
   a chip capacitor electrically connected with said integrated circuit, said filter disposed on said substrate so as to cover said recess,
   wherein said filter and said substrate are virtually equal in size;
   said high-frequency module including a temperature-compensated oscillator comprising:
   a filter provided by a crystal oscillator; and
   an integrated circuit comprising:
   an oscillation circuit;
   an output terminal connected to said oscillation circuit;
   a temperature compensating circuit;
   a frequency control circuit; and
   a stabilized power supply circuit connected with a chip capacitor disposed outside said integrated circuit.

4. The high-frequency module according to claim 1, said high-frequency module including a receiver comprising:
   a first input terminal to which a high-frequency signal is input;
   an amplifier receiving the input signal input to said first input terminal through a first chip capacitor;
   a SAW filter receiving an output of said amplifier;
   a mixer receiving an output of said SAW filter at one input thereof;
   an output terminal to which an output of said mixer is delivered through a second chip capacitor; and
   a second input terminal to which a local oscillation frequency to be input to other input of said mixer through a third chip capacitor is input.

5. The high-frequency module according to claim 1, said high-frequency module including a transmitter comprising:
   an input terminal to which a high-frequency signal is input;
   a SAW filter receiving the input signal input to said input terminal through a first chip capacitor;
   an amplifier receiving an output of said SAW filter; and
   an output terminal to which an output of said amplifier is delivered through a second chip capacitor.

6. A high-frequency module comprising:
   a substrate made of an insulator;
   a recess formed in said substrate;
   a PPL integrated circuit flip-chip-mounted to the bottom surface of said recess; and
   a voltage-controlled oscillator electrically connected with said PPL integrated circuit, said voltage-controlled oscillator disposed on said substrate so as to cover said recess; and
   a low-pass filter made up of chip components electrically connected with said PPL integrated circuit, said low-pass filter contained within said recess;
   wherein an area of said PPL integrated circuit is smaller than that of said low-pass filter and wherein said filter and said substrate are virtually equal in size.

* * * * *

UNITED STATES PATENT AND TRADEMARK OFFICE
CERTIFICATE OF CORRECTION

PATENT NO. : 6,487,085 B1
DATED : November 26, 2002
INVENTOR(S) : Kimura et al.

It is certified that error appears in the above-identified patent and that said Letters Patent is hereby corrected as shown below:

<u>Column 10,</u>
Lines 54, 57, 61 and 63, delete "PPL", and insert -- PLL --.

Signed and Sealed this

Tenth Day of June, 2003

JAMES E. ROGAN
*Director of the United States Patent and Trademark Office*